(12) United States Patent
Mitchell et al.

(10) Patent No.: US 8,975,503 B2
(45) Date of Patent: Mar. 10, 2015

(54) THERMOELECTRIC ENERGY HARVESTING SYSTEM

(75) Inventors: Bradley James Mitchell, Snohomish, WA (US); Ty A. Larsen, Everett, WA (US); Trevor Milton Laib, Woodinville, WA (US); Kevin Scott Callahan, Shoreline, WA (US); Henry VanRensselaer Fletcher, III, Everett, WA (US)

(73) Assignee: The Boeing Company, Chicago, IL (US)

( * ) Notice: Subject to any disclaimer, the term of this patent is extended or adjusted under 35 U.S.C. 154(b) by 304 days.

(21) Appl. No.: 13/110,250

(22) Filed: May 18, 2011

(65) Prior Publication Data

US 2012/0291425 A1 Nov. 22, 2012

(51) Int. Cl.
*H01L 35/30* (2006.01)
*H01L 35/32* (2006.01)

(52) U.S. Cl.
CPC .................................. *H01L 35/32* (2013.01)
USPC ........... 136/200; 136/201; 136/202; 136/204; 136/205; 136/206

(58) Field of Classification Search
USPC ......................................... 136/250, 200–242
See application file for complete search history.

(56) References Cited

U.S. PATENT DOCUMENTS

| | | | |
|---|---|---|---|
| 1,765,563 A * | 6/1930 | Borden et al. ................. | 136/226 |
| 2,694,098 A | 11/1954 | Leins | |
| 3,284,245 A | 11/1966 | Nottage et al. | |
| 3,300,840 A * | 1/1967 | Marshall et al. .............. | 136/201 |
| 4,673,863 A * | 6/1987 | Swarbrick ..................... | 322/2 R |
| 6,075,199 A * | 6/2000 | Wong ............................. | 136/201 |
| 6,150,601 A * | 11/2000 | Schnatzmeyer et al. ...... | 136/201 |
| 7,488,888 B2 | 2/2009 | Mitchell et al. | |
| 7,765,811 B2 * | 8/2010 | Hershberger et al. ............ | 62/3.5 |
| 2008/0066796 A1 | 3/2008 | Mitchell et al. | |

FOREIGN PATENT DOCUMENTS

| | | |
|---|---|---|
| FR | 2917997 | 1/2009 |
| FR | 2947529 | 1/2011 |
| GB | 2447333 | 9/2008 |
| WO | WO2009062635 | 5/2009 |

OTHER PUBLICATIONS

Aircraft Environmental Control (2010), Isidoro Martinez.*
Machine translation of FR 2917997 dated Feb. 1, 2009. Ragot Patrick, Ligier Jean Louis.*
PCT search report dated Sep. 19, 2012 regarding PCT/US2012/032326, filing date Apr. 5, 2012, applicant The Boeing Company.
Battery and Energy Technologies, Electropaedia, Direct Conversion of Heat Energy to Electrical Energy, pp. 1-3, retrieved Mar. 17, 2011 http://www.mpoweruk.com/thermoelectricity.htm.
Chen et al., "Dispenser Printed Thermoelectric Energy Generators", PowerMEMS 2009, Washington DC, Dec. 1-4, 2009, pp. 277-280.

* cited by examiner

*Primary Examiner* — Bach Dinh
(74) *Attorney, Agent, or Firm* — Yee & Associates, P.C.

(57) ABSTRACT

An apparatus comprising a structure and an energy harvesting device. The structure is configured to have a first portion and a second. The energy harvesting device is formed as part of the structure. The energy harvesting device is configured to generate an electrical current when a difference in temperature occurs between the first portion and the second portion.

17 Claims, 14 Drawing Sheets

THERMOELECTRIC ENERGY HARVESTING SYSTEM

BACKGROUND INFORMATION

1. Field

The present disclosure relates generally to energy and, in particular, to energy harvesting devices. Still more particularly, the present disclosure relates to a method and apparatus for generating electrical energy from thermal energy using thermoelectric energy harvesting devices.

2. Background

Electrical devices are often used in different platforms to perform various functions. For example, sensors, lighting elements, routers, switches, and/or other types of devices may be present on an aircraft. These devices use electrical power to function. Wires are typically used to connect these devices to power sources. Additionally, batteries also may be used with these types of devices.

The use of wiring is often undesirable. Wiring increases the cost to design, install, maintain, and upgrade devices. When a device uses a battery, the battery has a size selected to sufficiently power the device for some desired period of time. Further, these batteries may need replacement and/or recharging periodically. Further, the cost and maintenance for batteries may be greater than desired.

One solution involves using energy harvesting devices. Energy harvesting devices are hardware devices that generate energy from a source external to the hardware devices. For example, these external sources may be solar power, thermal energy, wind energy, salinity gradients, kinetic energy, and/or other suitable types of sources. Energy harvesting devices use these sources and generate electrical energy for use by other devices. For example, energy harvesting devices may be used to generate energy for electrical devices.

One example of an energy harvesting device is a solar cell. Solar cells convert light into electrical energy. These devices generate electrical energy in the form of an electrical current that may be stored in a battery for later use or may be used directly by another device. When batteries are used for storage, these batteries may be smaller than when the electrical devices rely on a battery as the only source of power.

Other types of energy harvesting devices include thermoelectric energy harvesting devices. These types of devices use temperature gradients to generate electrical energy. As another example, vibrational energy may be converted by cantilevered piezoelectric beams into electrical currents.

These types of devices are particularly useful with electronic devices that may need batteries or wired connections to electrical power sources. Energy harvesting devices, however, may still take up more space and add more complexity or cost than desired.

Therefore, it would be advantageous to have a method and apparatus that takes into account at least some of the issues discussed above, as well as possibly other issues.

SUMMARY

In one advantageous embodiment, an apparatus comprises a structure and an energy harvesting device. The structure is configured to have a first portion and a second portion. The energy harvesting device is formed as part of the structure. The energy harvesting device is configured to generate an electrical current when a difference in temperature occurs between the first portion and the second portion.

In another advantageous embodiment, an electrical current generation system comprises a structure and a number of thermopiles. The structure is configured to conduct heat in a manner that generates a temperature gradient between a first portion of the structure and a second portion of the structure. A number of thermopiles are formed as part of the structure. The number of thermopiles generates an electrical current when a desired temperature gradient is present between the first portion and the second portion.

In yet another advantageous embodiment, a method for manufacturing an electrical current generation system is provided. A structure having a first portion and a second portion is formed. An energy harvesting device is formed as part of the structure. The energy harvesting device is configured to generate an electrical current when a difference in temperature is present between the first portion and the second portion.

In still yet another advantageous embodiment, a method for generating an electrical current is provided. An energy harvesting device is attached to an object. The energy harvesting device is formed on a structure having a first portion and a second portion. An electrical current is received from the energy harvesting device. An electrical system is powered using the electrical current received from the energy harvesting device.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives, and advantages thereof, will best be understood by reference to the following detailed description of an advantageous embodiment of the present disclosure when read in conjunction with the accompanying drawings, wherein:

DETAILED DESCRIPTION

Figure 1:
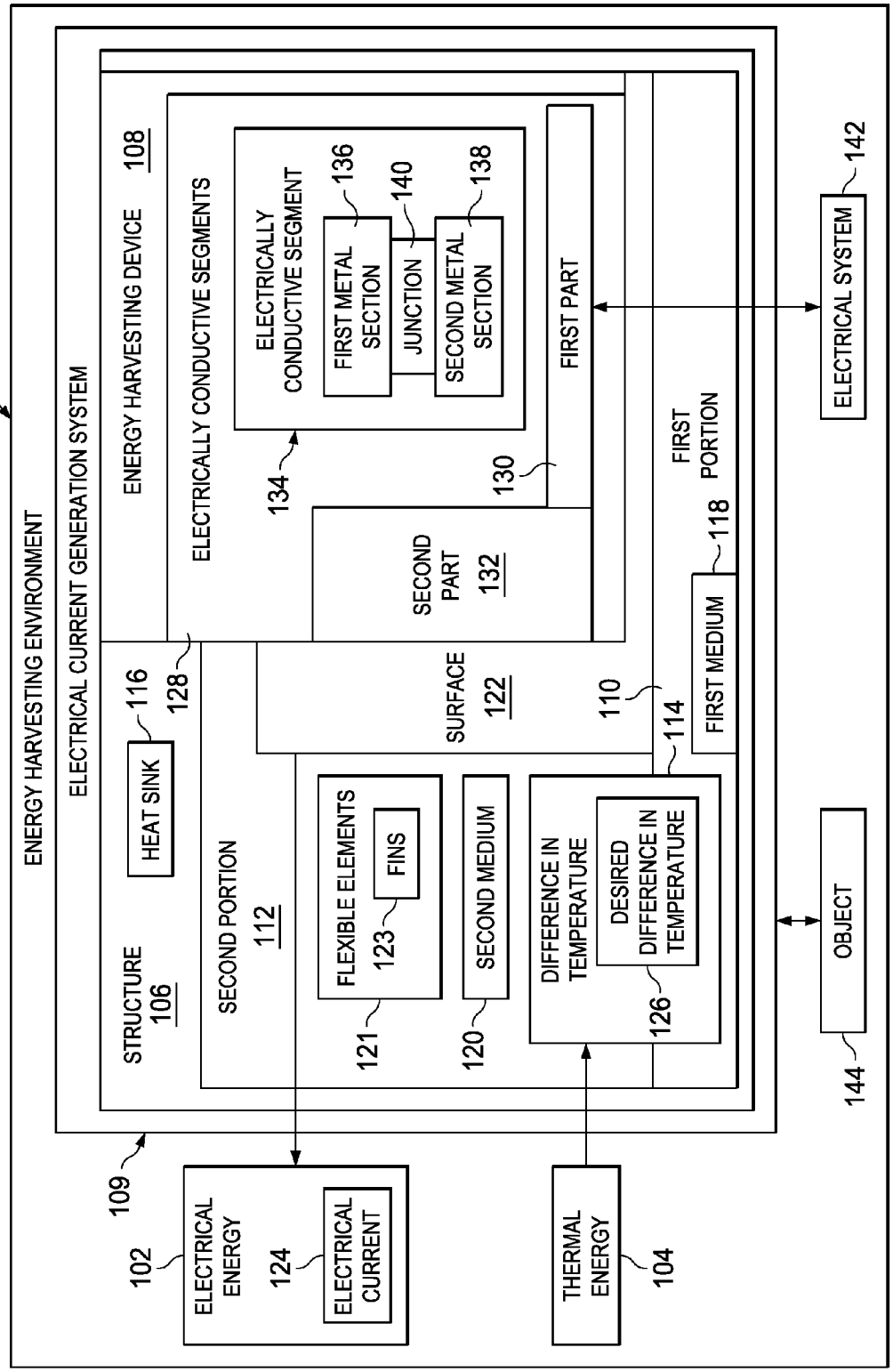
FIG. 1 is an illustration of a block diagram of an energy harvesting environment in accordance with an advantageous embodiment.

The different advantageous embodiments recognize and take into account a number of different considerations. For example, the different advantageous embodiments recognize and take into account that energy harvesting devices that generate electrical energy from thermal energy may be especially useful in platforms that have thermal gradients. In other words, a platform in which one location has a higher temperature than another location may provide a temperature difference that is large enough for an energy harvesting device to generate electrical current from the difference in temperature.

The different advantageous embodiments recognize and take into account that energy harvesting devices using thermopiles may be used to generate electrical current from these temperature differences. An energy harvesting device may have one or more thermopiles. A thermopile is an electronic device that converts thermal energy into electrical energy. A thermopile is often composed of several thermocouples that are usually connected in series, in parallel, or a combination of the two. A thermopile generates an output voltage that is related to the temperature of the thermopile.

These types of energy harvesting devices may be used to generate electrical current when they are placed near or in contact with structures in a platform, such as a hot pipe, an engine exhaust, or some other suitable heat source. The energy harvesting device may have one portion connected to the heat source and another portion exposed to a cooler environment.

The different advantageous embodiments recognize and take into account that thermopiles used in electrical harvesting devices are currently separate components that may be attached to a heat source. For example, energy harvesting devices that generate electrical current from a heat source using a thermopile are typically in a plate or wafer form. The thermopiles in the electrical energy harvesting device are typically placed between ceramic plates. These ceramic plates are typically planar and are connected to components, such as a pipe, exhaust tube, or other heat source.

The different advantageous embodiments recognize and take into account that an energy harvesting device that uses thermopiles is typically formed by placing the thermopiles between ceramic plates in a ceramic housing. The ceramic plates with the thermopiles are then connected to a heat source with a portion of the energy harvesting device being exposed to an environment with a cooler temperature than the heat source.

The different advantageous embodiments also recognize and take into account that these types of energy harvesting devices also may take up more room than desired. The thermopiles are typically formed so that they extend from one plate to another plate lengthwise. In other words, the thermopiles do not lay flat and extend from one edge to another edge of a ceramic plate.

The different advantageous embodiments also recognize and take into account that in some cases, the size of the ceramic plates may result in inadequate generation of electrical currents if insufficient contact to the heat source occurs. For example, with a pipe or exhaust tube, the surface of these structures may be curved. As a result, the ceramic plate for the thermoelectric energy harvesting device, which may be flat and not curved, may not have as much contact as desired with the pipe. One solution may be to employ smaller plate sizes so that the desired amount of contact occurs.

Further, the different advantageous embodiments recognize and take into account that another solution may use geometric adapter plates to conduct heat from a curved surface of a structure to the flat surface of the ceramic plates. In these cases, when geometric adapter plates are used, a thermal interface material may be used to provide sufficient contact. This thermal interface material may be needed in more areas than desired to provide the sufficient contact.

For example, the thermal interface material may be needed in areas, such as, for example, between the curved surface of the structure and a geometric adapter plate, between the geometric adapter plate and a first ceramic plate, between a second ceramic plate and a heat sink, and/or in other suitable areas. The thermal interface material may be, for example, a thermal grease, a thermal epoxy, a thermal pad, or some other suitable type of material.

The different advantageous embodiments recognize and take into account that these solutions, however, may increase the complexity, time, and effort needed to assemble and install devices needed to generate electrical energy from thermal energy. These types of solutions may require using or manufacturing energy harvesting devices with many different sizes and/or additional components to accommodate different curvatures of different heat sources.

Thus, the different advantageous embodiments provide an apparatus for generating an electrical current using thermal energy. In one advantageous embodiment, an apparatus comprises a structure configured to generate heat and an energy harvesting device formed as part of the structure. The heat generated by the structure is generated in a first portion of the structure. A second portion of the structure is cooler than the first portion of the structure when the heat is generated. The energy harvesting device is configured to generate an electrical current when a sufficient temperature difference is present between the first portion of the structure and the second portion of the structure.

With reference now to FIG. 1, an illustration of a block diagram of an energy harvesting environment is depicted in accordance with an advantageous embodiment. Energy harvesting environment 100 is an example of one type of environment in which the different advantageous embodiments may be implemented to generate electrical energy 102 using thermal energy 104.

In these illustrative examples, electrical energy 102 is generated from thermal energy 104 using structure 106 and energy harvesting device 108 in energy harvesting environment 100. Structure 106 has first portion 110 and second portion 112 in these examples.

Structure 106 may be any type of structure in which difference in temperature 114 may be generated. For example, second portion 112 may be configured to be cooler than first portion 110 such that difference in temperature 114 is generated. Difference in temperature 114 may also be referred to as a temperature gradient. The temperature gradient is a gradual change in temperature.

In one illustrative example, structure 106 takes the form of heat sink 116. Heat sink 116 may be any object configured to transfer thermal energy 104 from first medium 118 having a higher temperature to second medium 120 having a cooler temperature.

Typically, with a heat sink, such as heat sink 116, first medium 118 having the higher temperature takes the form of a solid medium, while second medium 120 having the cooler temperature takes the form of a fluid medium. The solid medium may be, for example, a metal material, a metal alloy material, plastic, and/or some other suitable type of solid material. The fluid medium may be, for example, a liquid, air, or some other type of fluid.

Of course, in some cases, first medium 118 may take the form of a fluid medium having a higher temperature than second medium 120. In still other illustrative examples, second medium 120 may take the form of a solid medium.

In these depicted examples, first medium 118 may be on or at a side of first portion 110 of heat sink 116, around first portion 110, and/or part of first portion 110. Further, second medium 120 may be on or at a side of second portion 112 of heat sink 116, around second portion 112, and/or part of second portion 112.

In one illustrative example, second portion 112 of heat sink 116 may comprise flexible elements 121. Flexible elements 121 may be in the form of fins 123. A fin is a surface that extends from an object to increase the rate of heat transfer to or from the environment by increasing convection. Further, fins 123 may be referred to as cooling fins when fins 123 are configured such that fins 123 have a cooler temperature than first portion 110 of heat sink 116. Fins 123 may include straight fins, pin fins, curved fins, angled fins, and/or other suitable types of fins.

As one illustrative example, difference in temperature 114 may be generated when a hot fluid flows near first portion 110 and a cold fluid is present around fins 123. In another illustrative example, difference in temperature 114 may be generated when first portion 110 generates heat and fins 123 are surrounded by cold air.

As illustrated, energy harvesting device 108 is formed as part of structure 106. Energy harvesting device 108 and structure 106 together form electrical current generation system 109.

In particular, in these depicted examples, energy harvesting device 108 is formed on surface 122 of structure 106 as part of structure 106. Surface 122 may be an outer surface, inner surface, or some other suitable type of surface of structure 106.

Surface 122 may have a shape that is substantially planar or curved prior to energy harvesting device 108 being formed on surface 122. In one illustrative example, surface 122 may be substantially planar prior to energy harvesting device 108 being formed on surface 122. In this illustrative example, once energy harvesting device 108 is formed, structure 106 may be manipulated to change the shape of surface 122 to being curved.

As depicted in these examples, energy harvesting device 108 is configured to generate electrical energy 102 in the form of electrical current 124 when difference in temperature 114 between first portion 110 and second portion 112 of structure 106 is sufficient for generating electrical current 124. In other words, when desired difference in temperature 126 is present between first portion 110 and second portion 112, energy harvesting device 108 generates electrical current 124.

In these illustrative examples, energy harvesting device 108 is formed on surface 122 of structure 106. In particular, first part 130 of energy harvesting device 108 may be formed on surface 122 of first portion 110 of structure 106, and second part 132 of energy harvesting device 108 may be formed on surface 122 of second portion 112 of structure 106.

Further, in these depicted examples, energy harvesting device 108 may comprise electrically conductive segments 128. Electrically conductive segment 134 is an example of one of electrically conductive segments 128. Electrically conductive segment 134 may comprise first metal section 136 and second metal section 138. A first metal in first metal section 136 may be different from a second metal in second metal section 138. In other words, first metal section 136 and second metal section 138 are comprised of dissimilar metals.

In these illustrative examples, first metal section 136 and second metal section 138 may be formed as part of structure 106 on surface 122 using a number of various processes. These processes may include at least one of spraying a first metal and a second metal onto surface 122 to form first metal section 136 and second metal section 138, respectively, depositing the first metal and the second metal onto surface 122, printing the first metal and the second metal onto surface 122, sintering a powdered form of the first metal and the second metal onto surface 122, chemical vapor deposition, electron beam epitaxy, molecular beam epitaxy, and/or some other suitable type of process.

As used herein, the phrase "at least one of", when used with a list of items, means that different combinations of one or more of the listed items may be used and only one of each item in the list may be needed. For example, "at least one of item A, item B, and item C" may include, for example, without limitation, item A, or item A and item B. This example also may include item A, item B, and item C, or item B and item C.

First metal section 136 and second metal section 138 may have junction 140 at which first metal section 136 and second metal section 138 are connected to each other and/or placed near each other. Of course, in some cases, a number of sections comprising various types of conductive material may be present between first metal section 136 and second metal section 138 at junction 140. When the number of sections is present at junction 140, the temperature at the connection between first metal section 136 and the number of sections and the temperature at the connection between second metal section 138 and the number of sections is substantially the same.

Junction 140 between first metal section 136 and second metal section 138 is configured such that the temperature of first metal section 136 and second metal section 138 changes along the length of these sections beginning at junction 140. When electrically conductive segment 134 is formed as part of structure 106, this change in temperature may be caused by difference in temperature 114 generated between first portion 110 and second portion 112 of structure 106.

Of course, in these illustrative examples, electrically conductive segment 134 may have one or more additional junctions at which electrically conductive segment 134 is connected to another electrically conductive segment in electrically conductive segments 128 and/or an electrical device.

When desired difference in temperature 126 is present between first portion 110 and second portion 112, desired difference in temperature 126 is also present along first metal section 136 and second metal section 138. A presence of desired difference in temperature 126 may cause electrically conductive segment 134 to generate electrical current 124.

In these illustrative examples, electrically conductive segment 134 may take the form of a thermocouple. In this manner, when electrically conductive segments 128 take the form of a plurality of thermocouples, energy harvesting device 108 takes the form of a thermopile. As used herein, "a plurality of items" means two or more items. For example, "a plurality of thermocouples" means two or more thermocouples. The plurality of thermocouples may be connected to each other in parallel, in series, or in a combination of in parallel and in series.

As depicted, electrical system 142 may be electrically connected to electrically conductive segments 128. As used herein, when a first component, such as electrical system 142, is electrically connected to a second component, such as one or more of electrically conductive segments 128, the first component is connected to the second component such that an electrical signal can be sent from the first component to the second component, the second component to the first component, or a combination of the two. The first component may be electrically connected to the second component without any additional components between the two components. The first component also may be electrically connected to the second component by one or more other components.

For example, one electronic device may be electrically connected to a second electronic device without any additional electronic devices between the first electronic device and the second electronic device. In some cases, another electronic device may be present between the two electronic devices that are electrically connected to each other.

In these illustrative examples, electrical system 142 may be connected to at least one of electrically conductive segments 128. Electrical system 142 may be one or more electrical devices. For example, an electrical device in electrical system 142 may take the form of, for example, without limitation, a sensor, a camera, a thermometer, a switch, a fan, a pump, a battery, a capacitor, a radio device, a wireless access port, and/or some other suitable type of electrical or electronic device.

Electrically conductive segments 128 may supply electrical current 124 to electrical system 142. In this manner, electrical energy 102 in the form of electrical current 124 may be harvested by energy harvesting device 108 to supply power to electrical system 142.

Additionally, in some illustrative examples, structure 106 may be associated with another structure, such as object 144. In one illustrative example, object 144 may be configured to generate heat to heat first portion 110 of structure 106. As another example, object 144 may be configured to transfer heat to first portion 110 of structure 106 such that first portion 110 has a higher temperature than second portion 112.

Object 144 may be associated with structure 106. For example, a portion of object 144 may be in contact with a portion of structure 106. As another example, object 144 may be placed near or close to structure 106.

In these illustrative examples, structure 106 and object 144 may take various forms. For example, structure 106 and/or object 144 may take the form of at least one of a pipe, a metal sheet, a tube, an exhaust tube, an engine exhaust, an engine intake, an exhaust manifold for an engine, a clamp, a band strap, a bulkhead, a beam, a floorboard, a floor beam, and/or some other suitable type of structure or object.

Further, structure 106 and/or object 144 may be associated with a platform. The platform may be selected from one of, for example, without limitation, a mobile platform, a stationary platform, a land-based structure, an aquatic-based structure, a space-based structure, an aircraft, a surface ship, a tank, a personnel carrier, a train, a spacecraft, a space station, a satellite, a submarine, an automobile, a power plant, a bridge, a dam, a manufacturing facility, a building, and/or some other suitable type of platform.

The illustration of energy harvesting environment 100 in FIG. 1 is not meant to imply physical or architectural limitations to the manner in which an advantageous embodiment may be implemented. Other components in addition to and/or in place of the ones illustrated may be used. Some components may be unnecessary. Also, the blocks are presented to illustrate some functional components. One or more of these blocks may be combined and/or divided into different blocks when implemented in an advantageous embodiment.

For example, in some illustrative examples, second portion 112 of heat sink 116 may comprise rigid elements instead of flexible elements 121. These rigid elements may still be referred to as fins 123, depending on the implementation.

In other illustrative examples, more than one of energy harvesting device 108 may be formed as part of structure 106. For example, structure 106 may have additional portions in addition to first portion 110 and second portion 112, which are configured to have difference in temperature 114. Additional energy harvesting devices may be formed as part of structure 106 to generate electrical current 124 based on the temperature difference between these other portions of structure 106.

Further, in still other examples, more than one object 144 may be configured to generate heat to heat first portion 110 of structure 106. In some cases, more than one electrical device in electrical system 142 may be electrically connected to electrically conductive segments 128.

With reference now to FIGS. 2-15, illustrations of an energy harvesting device formed as part of a structure are depicted in accordance with an advantageous embodiment. Various configurations and uses of a structure with an energy harvesting device formed as part of the structure are shown in FIGS. 2-15. The different components shown in these figures may be combined with components in FIG. 1, used with components in FIG. 1, or a combination of the two. Additionally, some of the components in these figures may be illustrative examples of how components shown in block form in FIG. 1 can be implemented as physical structures.

Figure 2:
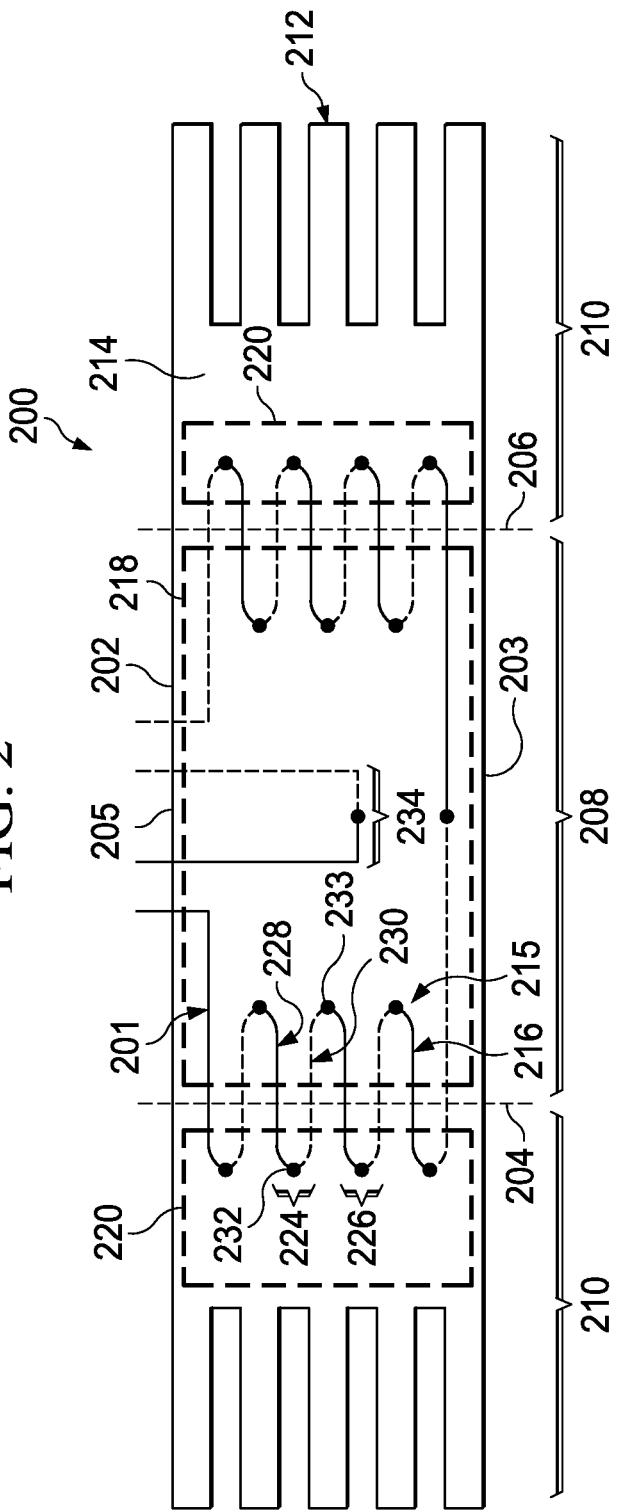
FIG. 2 is an illustration of a structure in accordance with an advantageous embodiment.

Turning now to FIG. 2, structure 200 is an example of one implementation for structure 106 in FIG. 1. Energy harvesting device 201 is an example of one implementation for energy harvesting device 108 in FIG. 1.

As depicted, structure 200 takes the form of metal sheet 202 in this example. Metal sheet 202 is substantially planar in this figure. Metal sheet 202 has side 203 and side 205. Line 204 and line 206 indicate where metal sheet 202 may be bent when attaching structure 200 to another object.

In this illustrative example, metal sheet 202 has first portion 208 and second portion 210. First portion 208 is the area of metal sheet 202 between line 204 and line 206. Second portion 210 includes the areas of metal sheet 202 extending outward from line 204 and line 206. In this illustrative example, second portion 210 is non-contiguous and comprises different areas of metal sheet 202.

Further, second portion 210 includes fins 212. Fins 212 are examples of one implementation for flexible elements 121 in FIG. 1. In some cases, metal sheet 202 may be cut to form fins 212.

As depicted, energy harvesting device 201 is formed as part of metal sheet 202. In particular, energy harvesting device 201 is formed as part of metal sheet 202 on surface 214 of metal sheet 202.

Energy harvesting device 201 takes the form of thermopile 215. Thermopile 215 is formed on surface 214 of metal sheet 202 such that first part 218 of thermopile 215 is formed on surface 214 of first portion 208 of metal sheet 202, and second part 220 of thermopile 215 is formed on surface 214 of second portion 210 of metal sheet 202.

Further, thermopile 215 comprises thermocouples 216. In this illustrative example, thermopile 215 may be formed on surface 214 by printing thermocouples 216 onto surface 214 of structure 200. Thermocouples 216 are connected in series in this illustrative example. As one specific example, thermocouple 224 and thermocouple 226 are connected in series on surface 214 of metal sheet 202. As depicted, thermocouple 224 has first metal section 228 and second metal section 230 connected at junction 232. Further, thermocouple 224 is connected to thermocouple 226 at junction 233.

First metal section 228 is comprised of a different type of metal than then the type of metal comprising second metal section 230 in this illustrative example. In other words, first metal section 228 and second metal section 230 are comprised of dissimilar metals with respect to each other.

Additionally, thermocouples 216 also include thermocouple 234, which may be connected to an electrical device in electrical system 142 in FIG. 1. For example, thermocouple 234 may be connected to a sensor device in electrical system 142 in FIG. 1.

Figure 3:
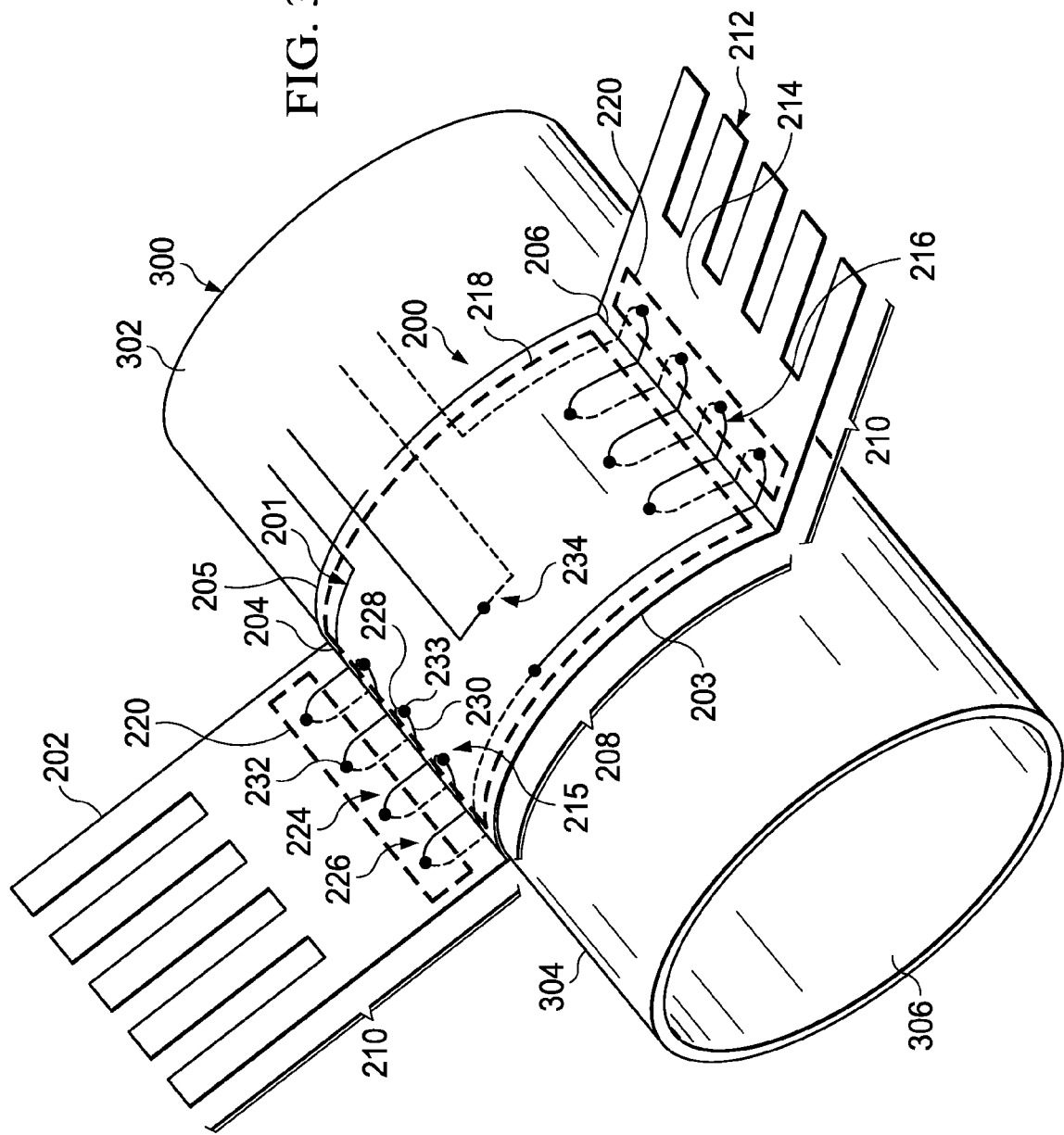
FIG. 3 is an illustration of a perspective view of a structure with an energy harvesting device formed on the structure in accordance with an advantageous embodiment.

With reference now to FIG. 3, an illustration of a perspective view of structure 200 with energy harvesting device 201 formed on structure 200 associated with an object is depicted in accordance with an advantageous embodiment. In this illustrative example, structure 200 from FIG. 2 is associated with object 300. Object 300 is an example of one implementation for object 144 in FIG. 1. In particular, structure 200 is placed on object 300. Object 300 takes the form of duct tube 302 in this depicted example.

As illustrated, duct tube 302 has curved surface 304. Structure 200 has been manipulated to conform to curved surface 304. In particular, metal sheet 202 has been bent along line 204 and line 206 such that first portion 208 of metal sheet 202 has a shape that conforms to curved surface 304 of duct tube 302.

Further, the bending of metal sheet 202 along line 204 and line 206 causes second portion 210 of metal sheet 202 to extend away from curved surface 304 of duct tube 302 and away from first portion 208 of metal sheet 202. In this manner, fins 212 extend away from first portion 208 of metal sheet 202. Further, the bending of metal sheet 202 causes second part 220 of thermocouples 216 to extend away from first part 218 of thermocouples 216.

In this illustrative example, hot fluid may flow through channel 306 of duct tube 302. The hot fluid may be, for example, a warm or hot liquid or warm or hot air. The hot fluid may cause duct tube 302 to heat. This heat may, in turn, heat first portion 208 of metal sheet 202. Further, second portion 210 may be surrounded by cold air in this illustrative example.

The heating of first portion 208 of metal sheet 202 causes first portion 208 to have a higher temperature than second portion 210 surrounded by cold air such that a difference in temperature is present between first portion 208 and second portion 210. When this difference in temperature reaches a desired difference in temperature, thermocouples 216 are configured to generate an electrical current. Thermocouples 216 may supply the electrical current to an electrical system such as, for example, a sensor device.

Figure 4:
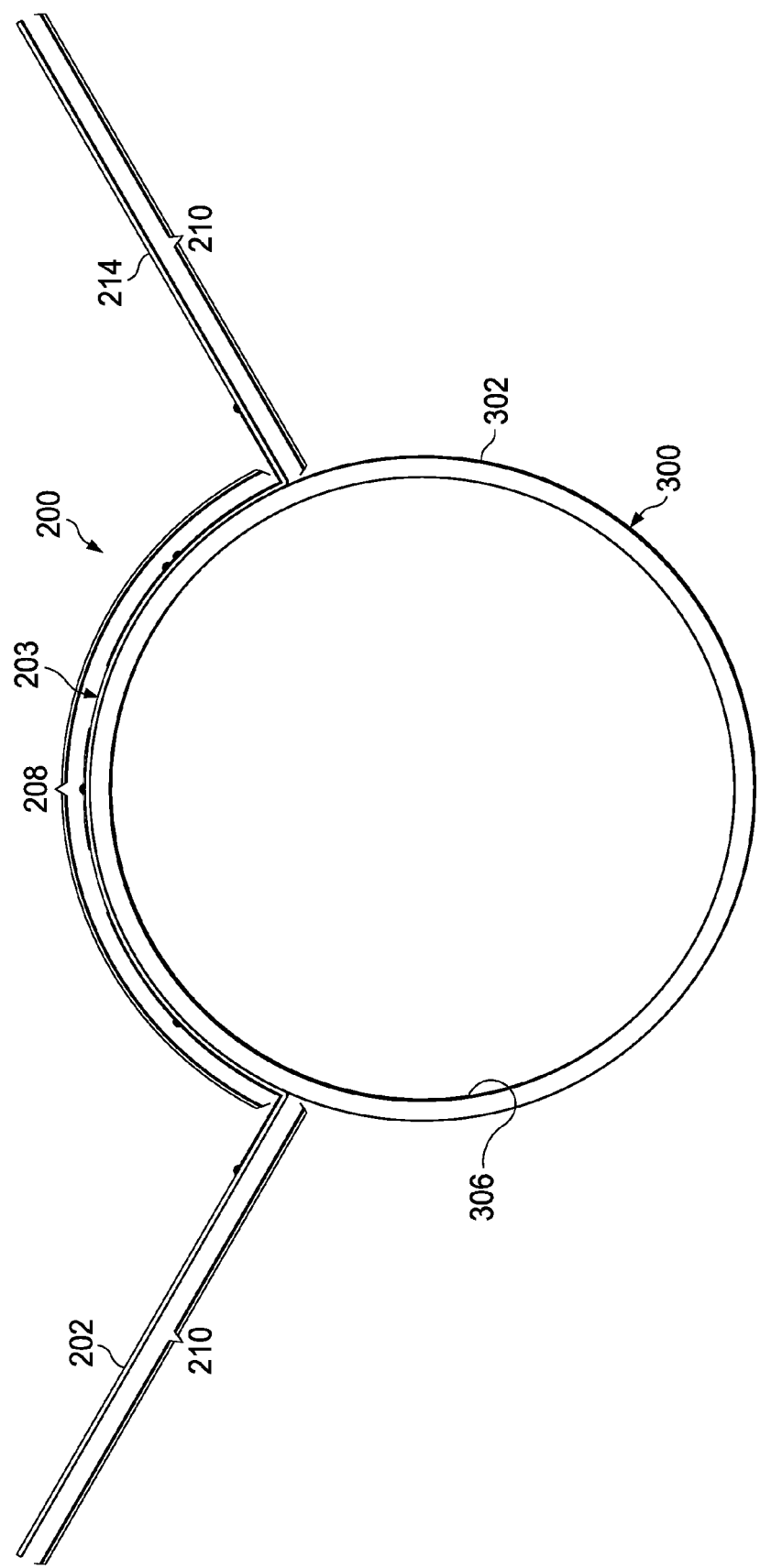
FIG. 4 is an illustration of a side view of a structure with an energy harvesting device formed on the structure in accordance with an advantageous embodiment.

With reference now to FIG. 4, an illustration of a view of structure 200 from side 203 with energy harvesting device 201 formed on structure 200 associated with object 300 is depicted in accordance with an advantageous embodiment. In this illustrative example, energy harvesting device 201 may not be seen in this view. As illustrated, hot fluid may flow through channel 306 in duct tube 302.

Figure 5:
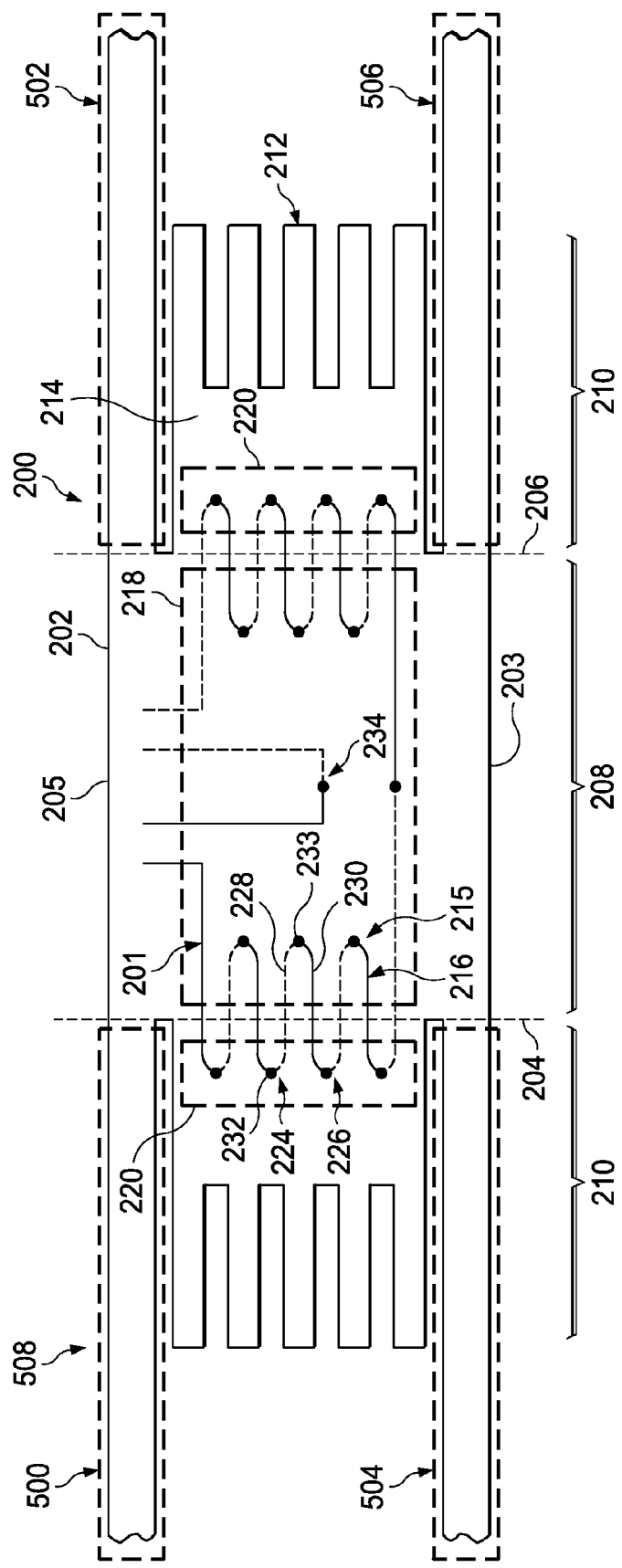
FIG. 5 is an illustration of a different configuration for a structure in accordance with an advantageous embodiment.

Turning now to FIG. 5, an illustration of a different configuration for structure 200 is depicted in accordance with an advantageous embodiment. In this illustrative example, structure 200 is in the form of metal sheet 202 and has a different configuration as compared to the configuration of structure 200 in FIGS. 2-4.

As illustrated, metal sheet 202 has metal bands 500, 502, 504, and 506 formed from metal sheet 202. Metal bands 500, 502, 504, and 506 form third portion 508 of metal sheet 202. Metal bands 500, 502, 504, and 506 are bands configured to attach metal sheet 202 to an object, such as object 300 in FIG. 3. In particular, these metal bands may be referred to as attachment bands that allow metal sheet 202 to wrap around the object to attach metal sheet 202 to the object.

Figure 6:
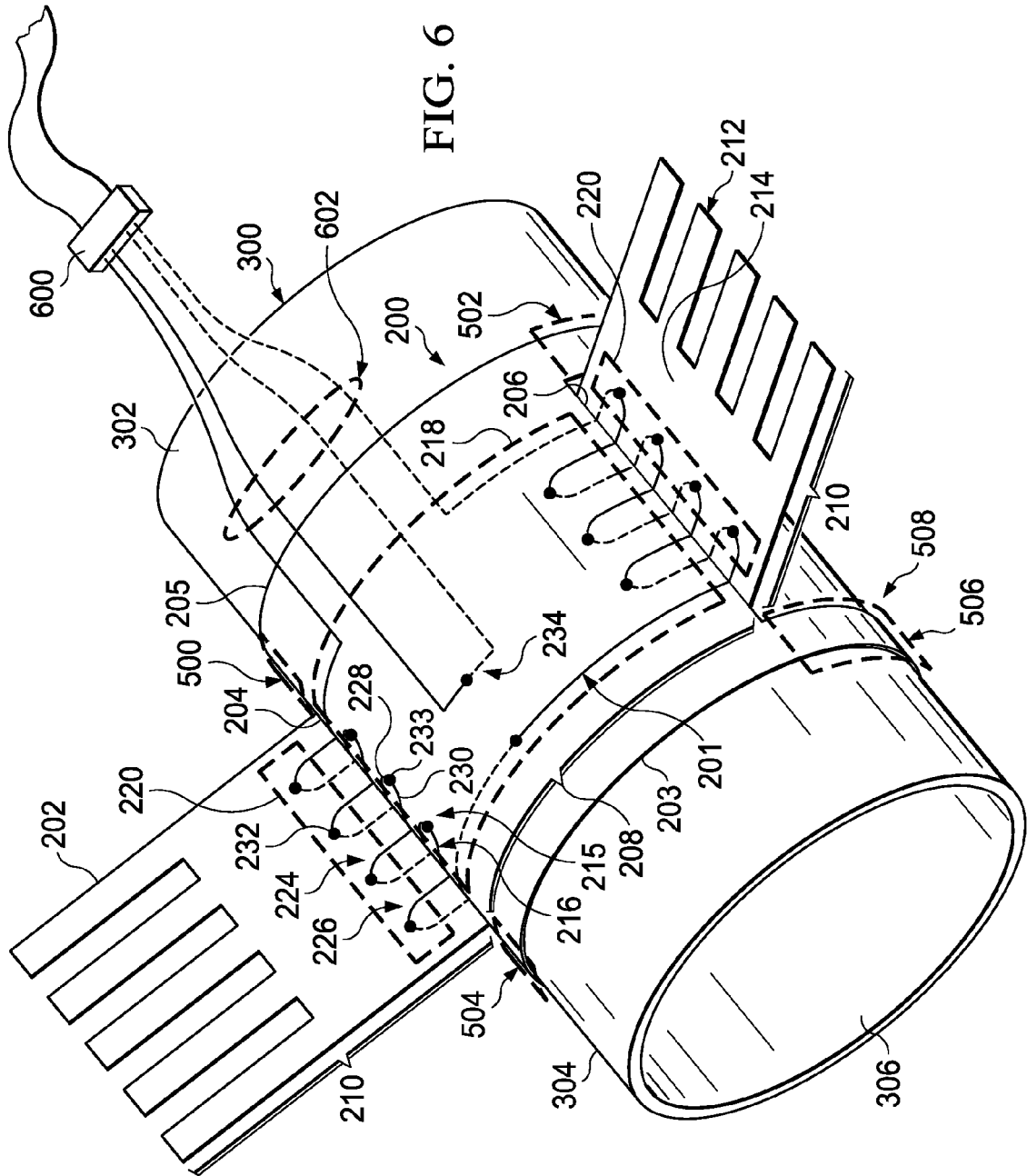
FIG. 6 is an illustration of a structure having metal bands attached to an object in accordance with an advantageous embodiment.

With reference now to FIG. 6, an illustration of structure 200 having metal bands 500, 502, 504, and 506 attached to object 300 is depicted in accordance with an advantageous embodiment. In this illustrative example, metal bands 500, 502, 504, and 506 are shown wrapped around object 300. Metal bands 500, 502, 504, and 506 attach metal sheet 202 to object 300. As depicted, a component, such as component 600 may be connected to thermocouples 216 at ends 602 of thermocouples 216.

Figure 7:
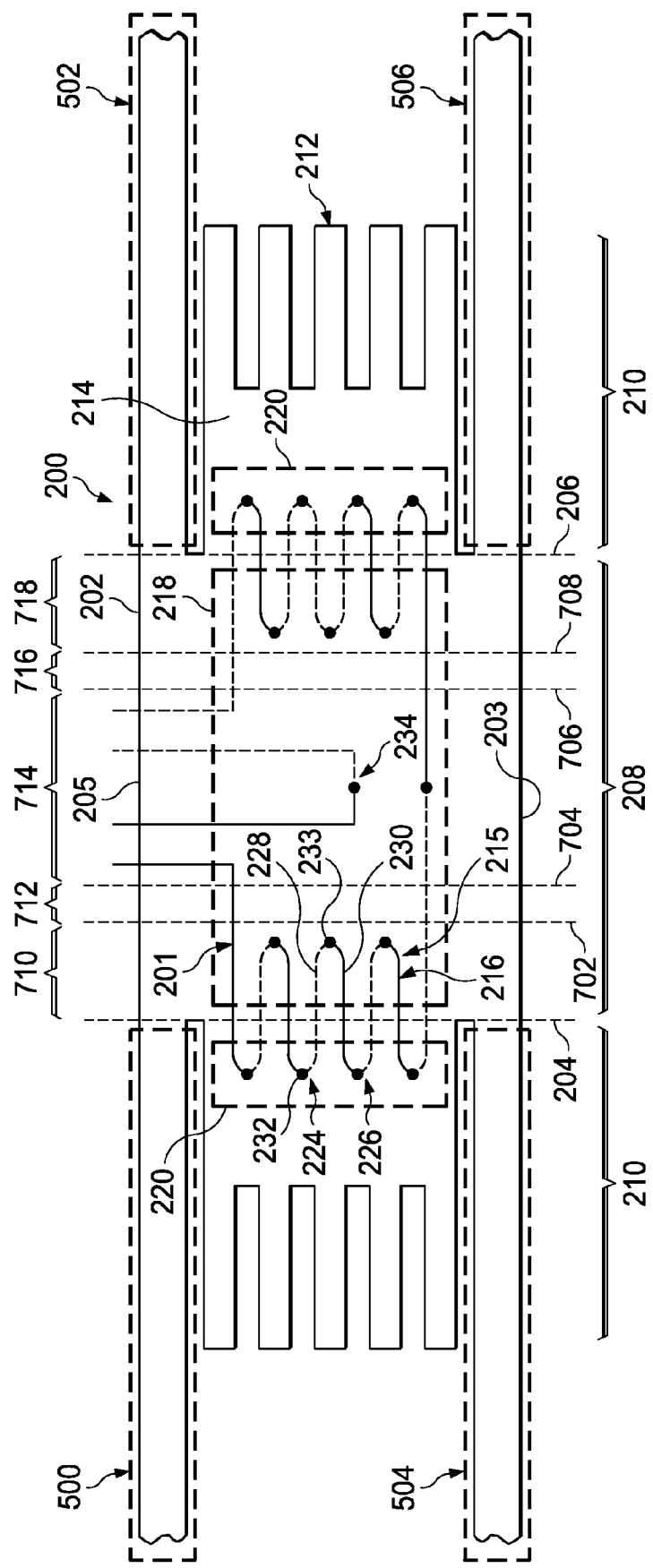
FIG. 7 is an illustration of a structure having additional lines in accordance with an advantageous embodiment.

Referring now to FIG. 7, an illustration of structure 200 with the configuration of structure 200 from FIG. 5 with additional lines is depicted in accordance with an advantageous embodiment. In this illustrative example, lines 702, 704, 706, and 708 are present for metal sheet 202 in addition to line 204 and line 206. Bending metal sheet 202 along lines 702, 704, 706, and 708 may form sections 710, 712, 714, 716, and 718 from first portion 208 of metal sheet 202.

Figure 8:
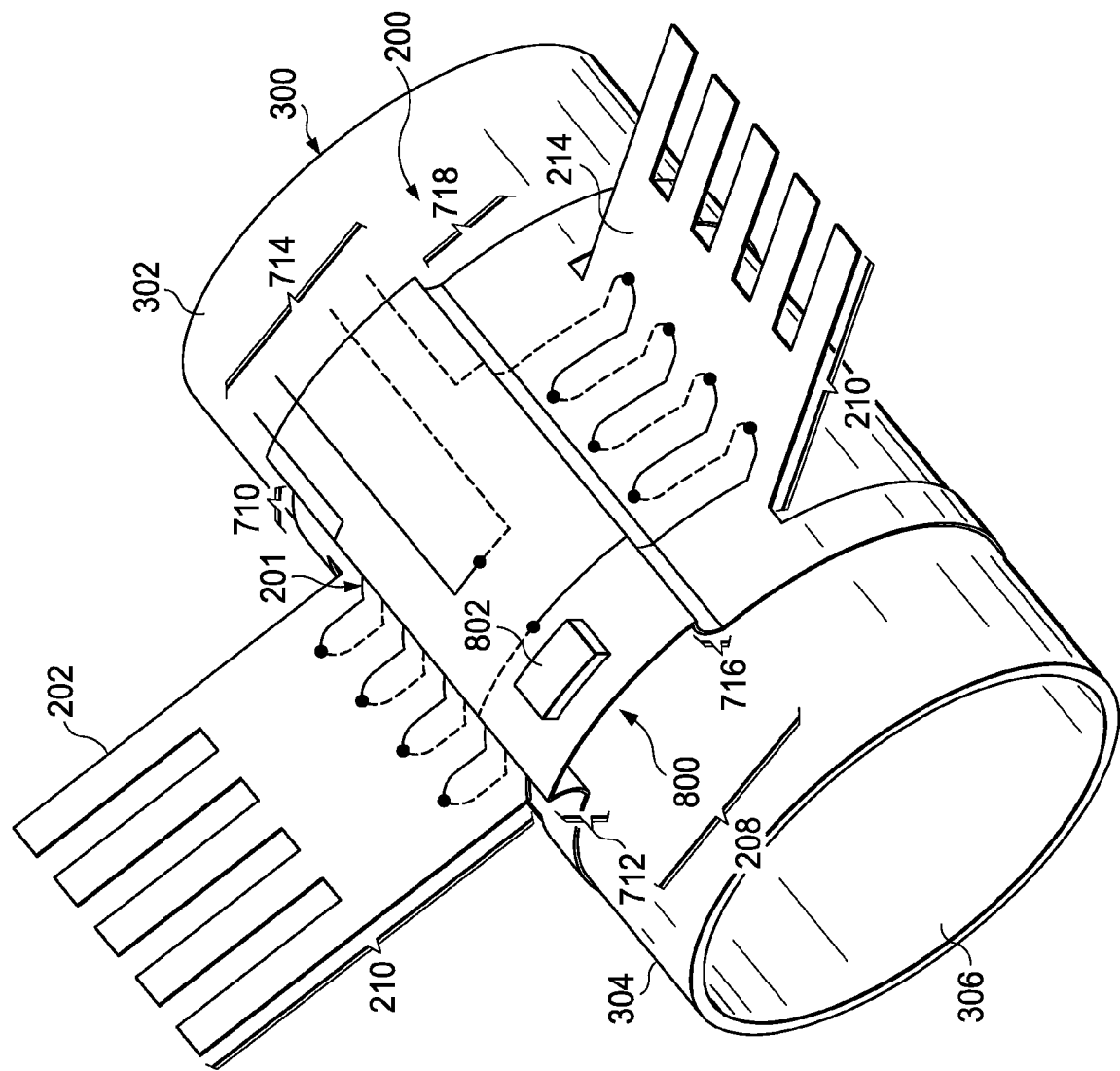
FIG. 8 is an illustration of a structure bent along lines and attached to an object in accordance with an advantageous embodiment.

Turning now to FIG. 8, an illustration of structure 200 bent along lines 702, 704, 706, and 708 from FIG. 7 and attached to object 300 is depicted in accordance with an advantageous embodiment. As depicted, this bending of metal sheet 202 forms sections 710, 712, 714, 716, and 718 such that section 714 has separation 800 from curved surface 304 of object 300 in the form of duct tube 302. Separation 800 allows a component, such as component 802, to be mounted to section 714 of metal sheet 202 to remain thermally isolated from duct tube 302.

As illustrated, section 710 and section 718 of first portion 208 of metal sheet 202 are attached to curved surface 304 of duct tube 302. This attachment allows heating of section 710 and section 718 when hot fluid passes through channel 306 of duct tube 302.

The illustration of structure 200 in FIGS. 2-8 is not meant to imply physical or architectural limitations to the manner in which an advantageous embodiment may be implemented. Other components in addition to and/or in place of the ones illustrated may be used. Some components may be unnecessary.

For example, in some illustrative examples, a number of thermopiles in addition to or in place of thermopile 215 may be associated with structure 200. In other illustrative examples, structure 200 may not take the form of metal sheet 202. Instead, structure 200 may be a sheet comprised of one or more materials in addition to and/or in place of metal.

For example, structure 200 may be comprised of materials comprising at least one of a metal, a metal alloy, a composite material, and/or any other suitable type of material that conducts heat with a desired level of thermal conductivity. A thermally conductive material is any material that conducts heat. These materials may include, for example, at least one of a composite material, a plastic comprising thermally conductive additives, a thermal paste, a metallic particle laced thermal paste, lithium, metal alloys, encapsulated liquids, carbon nanotube, formed ceramic, grapheme, diamond powder paste, and/or other suitable types of thermally conductive materials.

Further, in some cases, when structure 200 is comprised of an electrically conductive material, a substantially non-electrically conductive material may be deposited between portions of structure 200 and thermocouples 216. For example, the substantially non-electrically conductive material may be deposited in a number of areas between locations for thermocouples 216.

This substantially non-electrically conductive material may reduce and/or prevent the possibility of an electrical short circuit between thermocouples 216 through the electrically conductive surface of structure 200. The substantially non-electrically conductive material may be, for example, without limitation, a dielectric material, a ceramic, a spinel, and/or some other suitable type of material.

Figure 9:
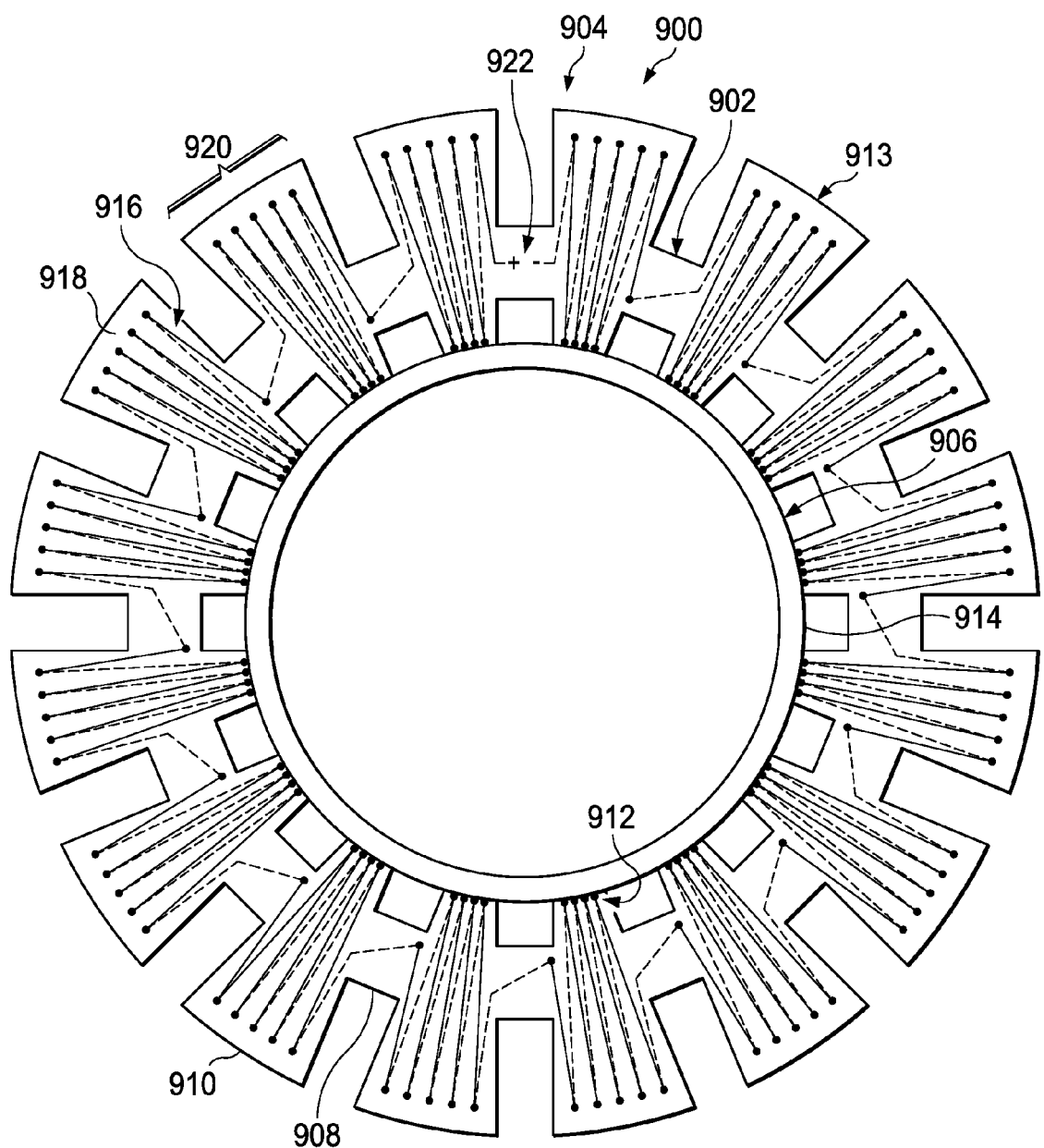
FIG. 9 is an illustration of a structure associated with an object in accordance with an advantageous embodiment.

With reference now to FIG. 9, an illustration of a structure associated with an object is depicted in accordance with an advantageous embodiment. In this illustrative example, structure 900 is an example of one implementation for structure 106 in FIG. 1. As depicted, structure 900 takes the form of heat sink 902.

In this illustrative example, heat sink 902 is a metallic object that has circular shape 904. Circular shape 904 allows heat sink 902 to slide over pipe 906. Pipe 906 is an example of one implementation for object 144 in FIG. 1.

As depicted, heat sink 902 has first portion 908 and second portion 910. Further, heat sink 902 has contact springs 912 connected to first portion 908. Contact springs 912 contact curved surface 914 of pipe 906. Second portion 910 has fins 913 connected to first portion 908 of heat sink 902. Fins 913 are convection cooling fins in this illustrative example.

As depicted in this example, thermopile 916 is printed or deposited on surface 918 of heat sink 902. Thermopile 916 has sets of thermocouples connected in series in this example. Set of thermocouples 920 is an example of one of the sets of thermocouples in thermopile 916. The thermocouples in set of thermocouples 920 are connected in series.

As depicted, an object or component may be connected to thermopiles 916 at terminals 922 to receive electrical current generated by thermopiles 916.

Turning now to FIGS. 10-13, illustrations for the forming and installation of contact springs on an object are depicted in accordance with an advantageous embodiment.

Figure 10:
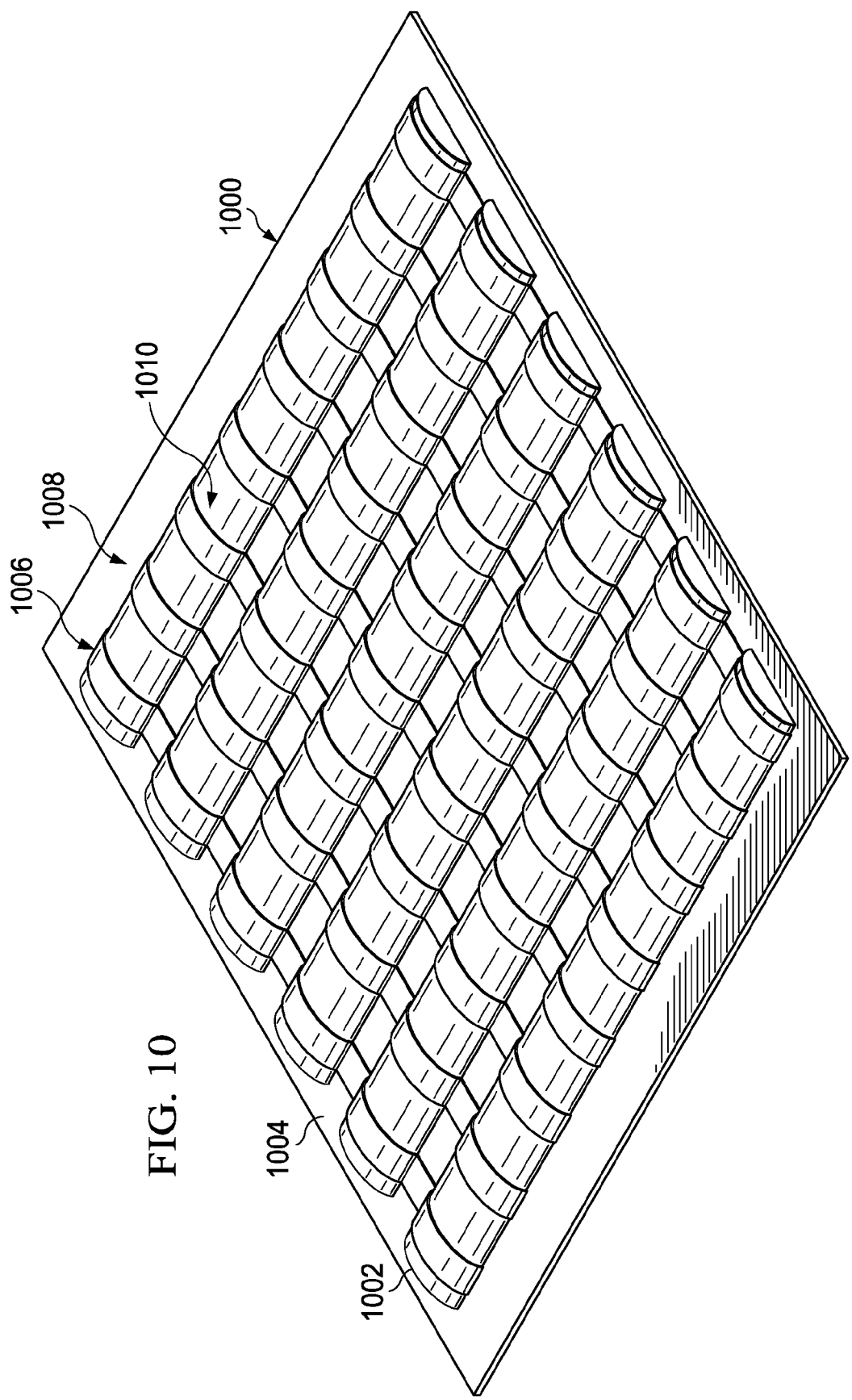
FIG. 10 is an illustration of an object with thermally conductive material sprayed over an object and supports on the object in accordance with an advantageous embodiment.

With reference now to FIG. 10, an illustration of an object with thermally conductive material sprayed over an object and supports on the object is depicted in accordance with an advantageous embodiment. In this illustrative example, object 1000 may be a metallic object. Of course, object 1000 may be comprised of other thermally conductive materials, such as composite materials.

Supports 1002 are placed on surface 1004 of object 1000. Supports 1002 provide a shape for forming thermally conductive strips using thermally conductive material. As depicted, thermally conductive material 1006 has been sprayed over supports 1002 and surface 1004 of object 1000 to form thermally conductive strips 1008. Thermally conductive material 1006 may be, for example, a metallic material and/or some other suitable type of thermally conductive material. These strips are formed substantially perpendicular to supports 1002. Further, as illustrated, supports 1002 are configured such that thermally conductive strips 1008 form curved shapes 1010.

In other illustrative examples, thermally conductive material 1006 may be deposited over supports 1002 and surface 1004 of object 1000 in some other suitable manner. For example, thermally conductive material 1006 may be formed by printing or painting this material on surface 1004 and supports 1002 of object 1000.

Thermally conductive material 1006 may be a material that adheres to surface 1004 of object 1000 in locations where the material is sprayed on surface 1004. In some cases, a thermally conductive adhesive or some other type of mechanism may be used to adhere thermally conductive material 1006 to surface 1004 of object 1000.

Figure 11:
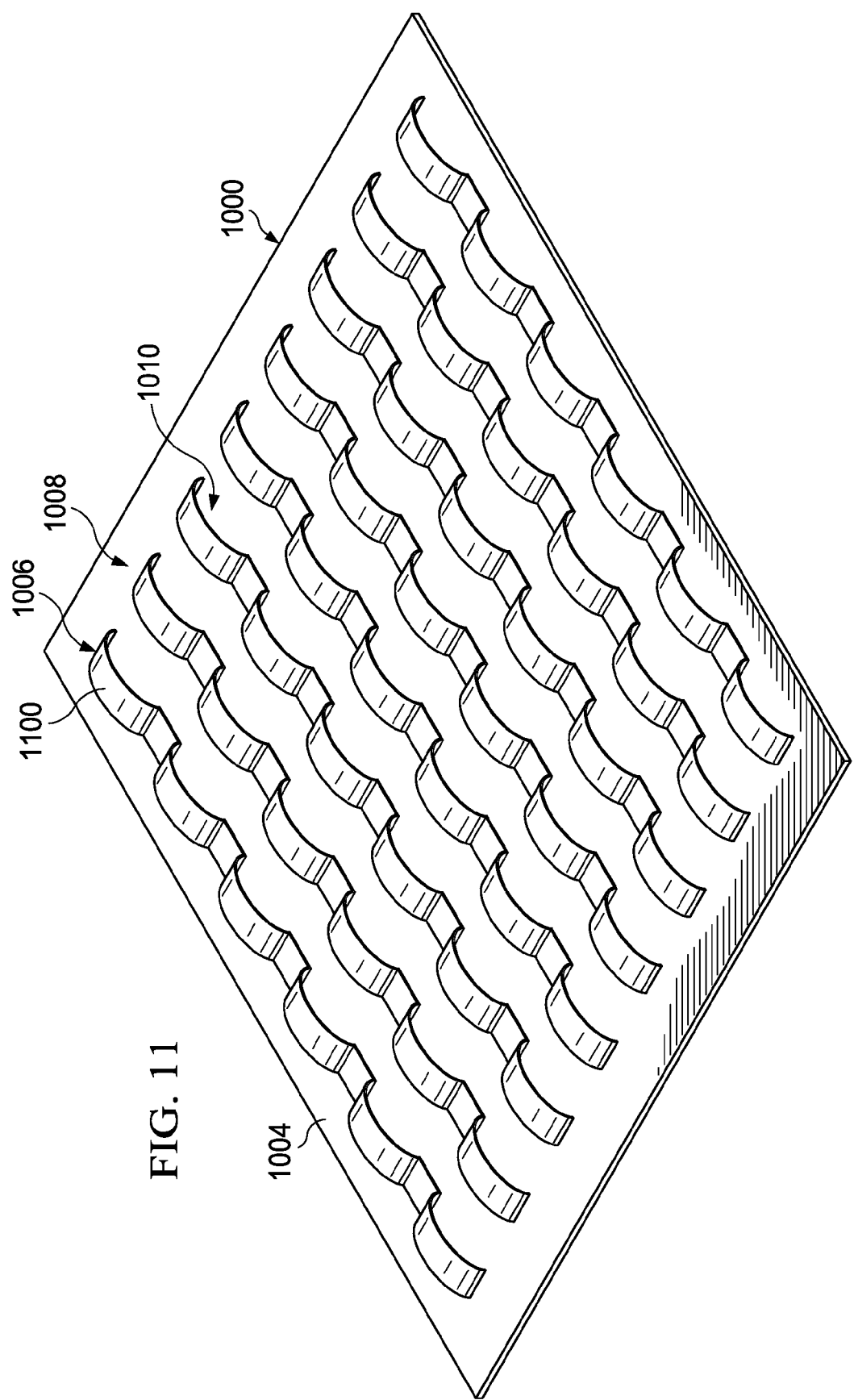
FIG. 11 is an illustration of an object with springs extending from the object in accordance with an advantageous embodiment.

Turning now to FIG. 11, an illustration of object 1000 with springs extending from object 1000 is depicted in accordance with an advantageous embodiment. In this illustrative example, supports 1002 have been removed. Supports 1002 may be removed by, for example, without limitation, chemically dissolving supports 1002, physically removing supports 1002, melting supports 1002, chemically etching supports 1002, and/or performing some other suitable type of removal operation.

With supports 1002 removed, thermally conductive strips 1008 form springs 1100. Springs 1100 extend from surface 1004 of object 1000. As depicted, more than one spring may be formed by each thermally conductive strip in thermally conductive strips 1008.

Figure 12:
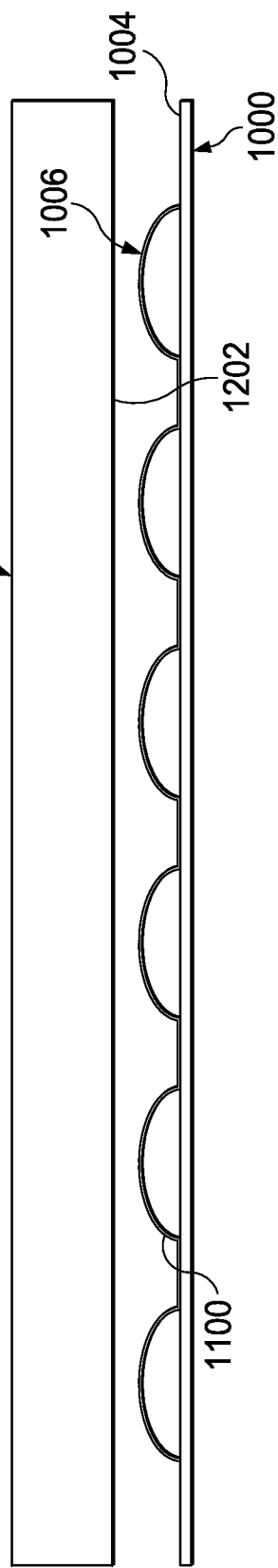
FIG. 12 is an illustration of a side view of springs extending from an object in accordance with an advantageous embodiment.

With reference now to FIG. 12, an illustration of a side view of springs 1100 extending from object 1000 is depicted in accordance with an advantageous embodiment. In this illustrative example, object 1000 has been moved into a position relative to object 1200. As depicted, springs 1100 are not in contact with surface 1202 of object 1200.

Figure 13:
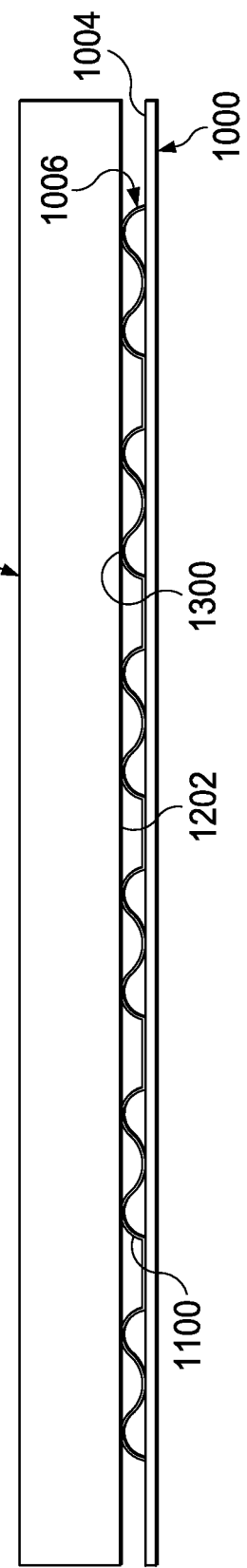
FIG. 13 is an illustration of a side view of springs extending from an object and in contact with the object in accordance with an advantageous embodiment.

Turning now to FIG. 13, an illustration of a side view of springs 1100 extending from object 1000 and in contact with object 1200 is depicted in accordance with an advantageous embodiment. As depicted in this example, object 1200 is placed over object 1000. In this manner, when object 1000 and object 1200 are moved towards each other, surface 1202 of object 1200 contacts surface 1300 of springs 1100. In other words, installation of object 1000 causes contact between surface 1202 of object 1200 and surface 1300 of springs 1100. This contact causes springs 1100 to deform and/or bend as shown such that locations of thermal contact between object 1200 and object 1000 may be formed.

The illustration of the manufacturing of springs 1100 and their use in FIGS. 10-13 are not meant to imply physical or architectural limitations to the manner in which an advantageous embodiment may be implemented. Other components in addition to and/or in place of the ones illustrated may be used. For example, springs 1100 may be formed having other types of shapes other than curved shapes 1010 depicted in FIG. 10.

Figure 14:
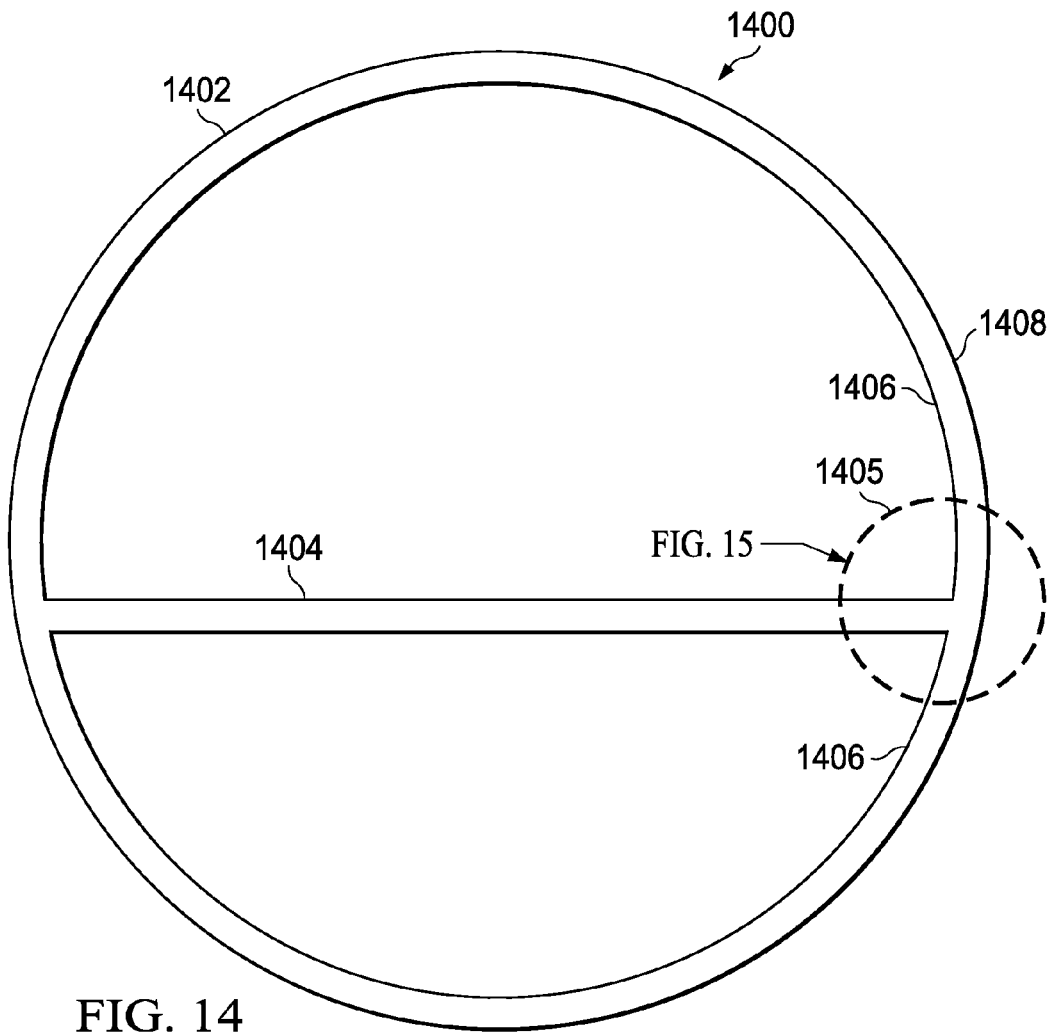
FIG. 14 is an illustration of a cross-sectional exposed view of the fuselage of an aircraft in accordance with an advantageous embodiment.

With reference now to FIG. 14, an illustration of a cross-sectional exposed view of the fuselage of an aircraft is depicted in accordance with an advantageous embodiment. In this illustrative example, aircraft 1400 has fuselage 1402. Further, aircraft 1400 also has floor beam 1404 that extends across fuselage 1402. For example, floor beam 1404 intersects with fuselage 1402 at section 1405.

A difference in temperature is present between side 1406 of fuselage 1402 and side 1408 of fuselage 1402. For example, the temperature inside of side 1406 of fuselage 1402 may be higher than the temperature on the outside of side 1408 of fuselage 1402. A skin (not shown) may be present on side 1408 of fuselage 1402 for aircraft 1400.

For example, side 1406 may be exposed to a first temperature. In this illustrative example, this first temperature is a temperature of the air inside fuselage 1402 or, in other words, the air inside the cabin of aircraft 1400. This first temperature may be about 20 degrees Celsius. Side 1408 of fuselage 1402 is exposed to a second temperature. This second temperature is a temperature of the air or environment around fuselage 1402 of aircraft 1400. Side 1408 may be exposed to a second temperature that may be, for example, about negative 30 degrees Celsius.

In this manner, side 1406 is exposed to a first temperature that is higher than the second temperature to which side 1408 is exposed. Thus, the temperature may become cooler and cooler in a direction from side 1406 to side 1408. This difference in temperature is a temperature gradient that may occur when aircraft 1400 is flying at high altitudes or is otherwise in use.

Figure 15:
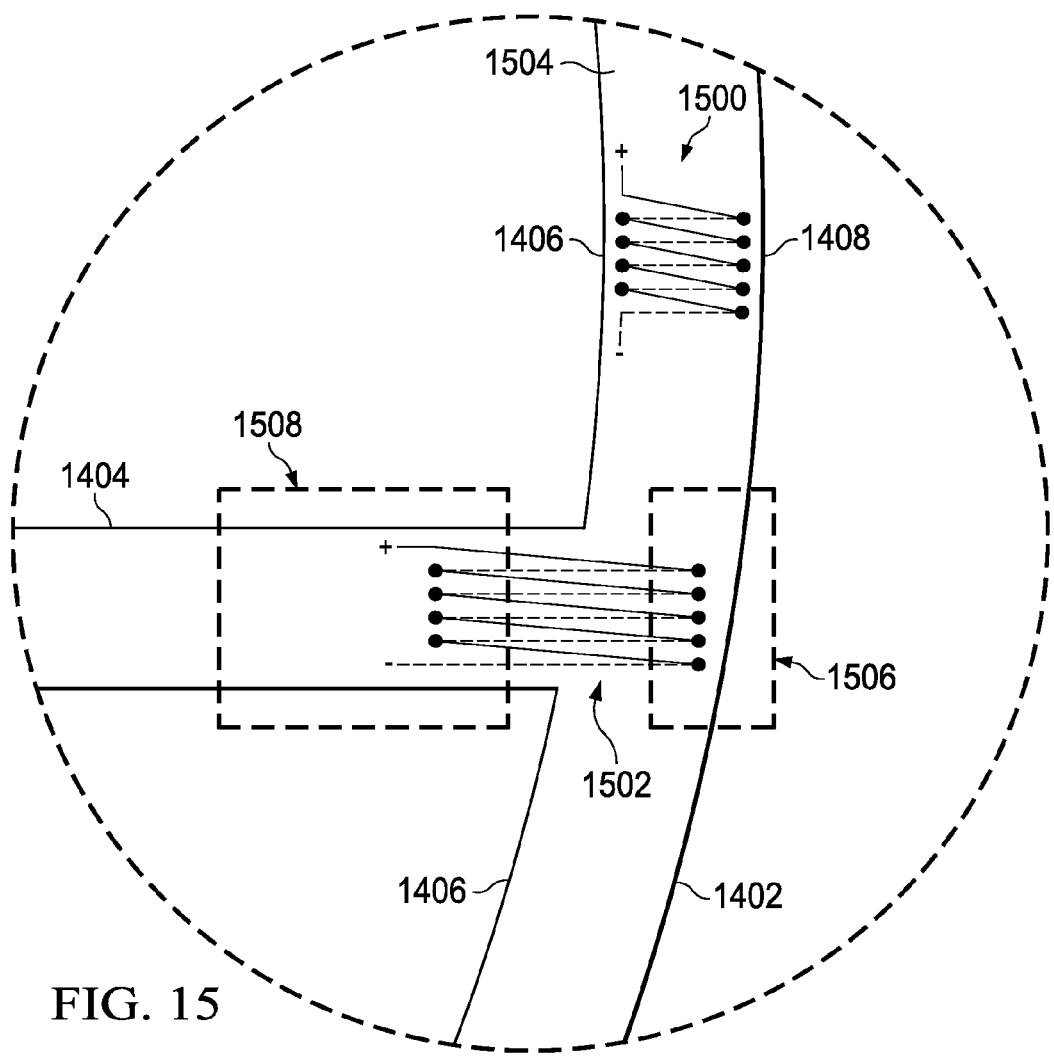
FIG. 15 is an illustration of an enlarged cross-sectional view of a section of an aircraft in accordance with an advantageous embodiment.

With reference now to FIG. 15, an illustration of an enlarged cross-sectional view of a section of an aircraft is depicted in accordance with an advantageous embodiment. In this illustrative example, section 1405 from FIG. 15 is depicted in an enlarged view.

As illustrated, thermopile 1500 and thermopile 1502 have been formed as part of fuselage 1402 and floor beam 1404. For example, thermopile 1500 is formed as part of fuselage 1402. Thermopile 1500 may be deposited in an interior of fuselage 1402 during the manufacturing of fuselage 1402. In this illustrative example, the interior of fuselage 1402 is an interior of frame 1504 forming fuselage 1402. As one illustrative example, thermopile 1500 may be deposited on frame 1504 of fuselage 1402 before manufacturing of fuselage 1402 has been completed or as part of manufacturing fuselage 1402.

Thermopile 1500 generates an electrical current in response to a temperature gradient caused by a difference in temperature between side 1406 and side 1408 of fuselage 1402.

In this illustrative example, thermopile 1502 is formed as part of floor beam 1404 at or near an intersection of floor beam 1404 and frame 1504 of fuselage 1402. For example, thermopile 1502 may be deposited on a surface of floor beam 1404 in this illustrative example. Thermopile 1502 generates an electrical current in response to a temperature gradient caused by the difference in temperature between end 1506 of floor beam 1404 and portion 1508 of floor beam 1404.

Portion 1508 of floor beam 1404 is exposed to a first temperature that is higher than a second temperature to which end 1506 of floor beam 1404 is exposed. In other words, the air in the cabin inside fuselage 1402 has a higher temperature than the air outside fuselage 1402. This difference in temperature may be greater when aircraft 1400 is flying at high altitudes and/or in use in some other manner as compared to when aircraft 1400 is flying at low altitudes, on the ground, and/or not in use.

In other illustrative examples, thermopiles may be formed in other locations within aircraft 1400. For example, thermopiles may be formed as part of an air vent, a wall, a door, a stringer, a rib, a bulkhead, an engine exhaust, an engine component, an engine mount, a floor truss, a fuel tank wall, a frame, and/or other suitable types of structures.

Figure 16:
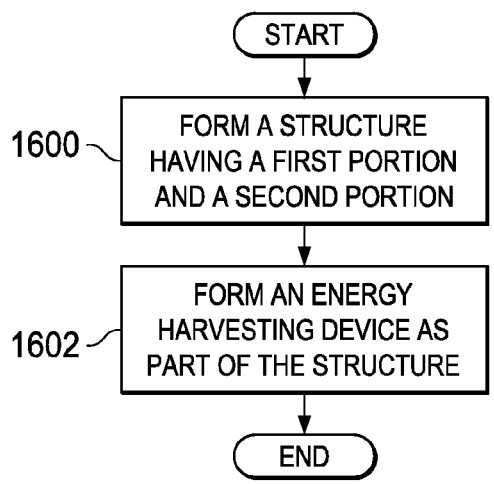
FIG. 16 is an illustration of a flowchart of a process for manufacturing an electrical current generation system in accordance with an advantageous embodiment.

With reference now to FIG. 16, an illustration of a flowchart of a process for manufacturing an electrical current generation system is depicted in accordance with an advantageous embodiment. The process illustrated in FIG. 16 may be implemented to form electrical current generation system 109 in FIG. 1.

The process begins by forming a structure having a first portion and a second portion (operation 1600). The second portion is configured to have a lower temperature than a temperature of the first portion. For example, the second portion of the structure may be exposed to a temperature that is lower than a temperature to which the first portion of the structure is exposed when the first portion of the structure is attached to a platform, connected to an object configured to generate heat, attached to a platform while the platform is in use, and/or heated in some other suitable manner.

The process forms an energy harvesting device as part of the structure (operation 1602), with the process terminating thereafter. The energy harvesting device is configured to generate an electrical current when a desired difference in temperature is present between the first portion and the second portion. Operation 1602 may be performed in a number of different ways.

For example, the energy harvesting device may comprise electrically conductive segments that are sprayed onto a surface of the structure, deposited onto a surface of the structure, printed onto a surface of the structure, chemically applied to an interior of the structure, and/or formed as part of the structure in some other suitable manner.

Further, depending on the implementation, operation 1602 may be performed during operation 1600. For example, operation 1602 may be performed to form the energy harvesting device in an interior of the structure prior to the forming of the structure being completed. Once the energy harvesting device has been formed, operation 1600 may then be completed to form the completed structure.

Figure 17:
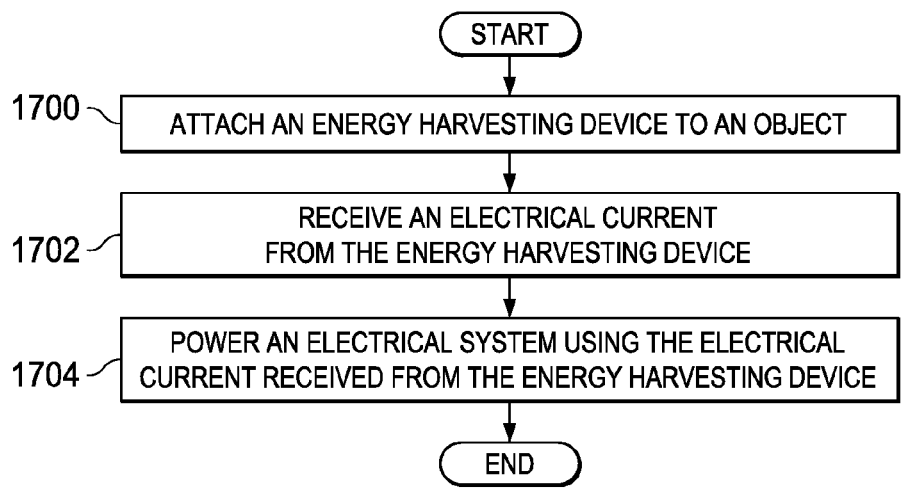
FIG. 17 is an illustration of a flowchart of a process for generating an electrical current in accordance with an advantageous embodiment.

With reference now to FIG. 17, an illustration of a flowchart of a process for generating an electrical current is depicted in accordance with an advantageous embodiment. The process illustrated in FIG. 17 may be implemented using electrical current generation system 109 in FIG. 1.

The process begins by attaching an energy harvesting device to an object (operation 1700). The energy harvesting device is formed on a structure having a first portion and a second portion. The first portion of the structure has a higher temperature than the second portion. Further, the structure is configured to transfer thermal energy from the first portion to the second portion.

The process receives an electrical current from the energy harvesting device (operation 1702). The electrical current is generated in response to the transfer of thermal energy from the first portion of the structure to the second portion of the structure. The process then powers an electrical system using the electrical current received from the energy harvesting device (operation 1704), with the process terminating thereafter.

The electrical system may, for example, comprise a sensor device that is connected to the energy harvesting system and configured to operate using the electrical current received from the energy harvesting device.

The flowcharts and block diagrams in the different depicted embodiments illustrate the architecture, functionality, and operation of some possible implementations of apparatus and methods in an advantageous embodiment. In this regard, each block in the flowchart or block diagrams may represent a module, segment, function, and/or a portion of an operation or step. For example, one or more of the blocks may be implemented as program code, in hardware, or a combination of the program code and hardware. When implemented in hardware, the hardware may, for example, take the form of integrated circuits that are manufactured or configured to perform one or more operations in the flowchart or block diagrams.

In some alternative implementations of an advantageous embodiment, the function or functions noted in the block may occur out of the order noted in the figures. For example, in some cases, two blocks shown in succession may be executed substantially concurrently, or the blocks may sometimes be executed in the reverse order, depending upon the functionality involved. Also, other blocks may be added in addition to the illustrated blocks in a flowchart or block diagram.

Thus, the different advantageous embodiments provide an apparatus comprising a structure. The structure is configured to have a first portion and a second portion in which the second portion has a lower temperature than a temperature of the first portion. The structure is configured to have an energy harvesting device formed as part of the structure. The energy harvesting device is configured to generate an electrical current when a desired difference in temperature is present between the first portion and the second portion.

In this manner, the different advantageous embodiments provide an energy harvesting device that is configured to span more widely-spaced temperature gradients as compared to currently used energy harvesting devices. Further, the different advantageous embodiments allow an energy harvesting device to be formed on both a first portion of a structure and a second portion of the structure that comprises cooling fins and has a lower temperature than the first portion.

The description of the different advantageous embodiments has been presented for purposes of illustration and description and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
   a tube configured to allow a flow of fluid through the tube, the fluid being hotter than an exterior temperature outside of the tube;
   a structure comprising a first portion integral with a second portion, wherein the first portion is attached to a first exterior surface of the tube and also conforms to a shape of the tube, wherein the second portion forms a bend angle relative to the first portion at an intersection of the first portion and the second portion in order that the second portion extends radially outwardly from the first exterior surface of the tube; and
   a thermopile attached to the structure, wherein a first part of the thermopile is formed on the first portion and a second part of the thermopile is formed on the second portion, wherein the thermopile comprises a plurality of thermal couples connected in series, wherein a first plurality of junctions of the plurality of thermal couples is on the first portion, and wherein a second plurality of junctions of the plurality of thermal couples is on the second portion.

2. The apparatus of claim 1, wherein the second portion comprises a fin and the plurality of thermal couples extend continuously from the first portion and onto the fin across the bend angle.

3. The apparatus of claim 1, wherein the structure comprises metal.

4. The apparatus of claim 1 further comprising:
   elements formed on the structure, wherein the elements increase heat transfer from the first portion of the structure to the second portion of the structure and wherein the elements comprise at least one of flexible elements and rigid elements.

5. The apparatus of claim 1 wherein the tube comprises a duct tube.

6. The apparatus of claim 5, wherein the tube is electrically conductive and the structure is comprised of a dielectric material configured to electrically insulate electrically conductive segments from the structure.

7. The apparatus of claim 1 further comprising:
   an electrical device electrically connected to the thermopile.

8. The apparatus of claim 7, wherein the electrical device is selected from one of a sensor, a camera, a capacitor, a thermometer, a switch, a fan, a pump, a battery, a radio device, and a wireless access port.

9. The apparatus of claim 1 wherein the structure is comprised of an electrically conductive material and wherein a dielectric material is deposited onto the structure in a number of areas between locations for the plurality of thermal couples before the plurality of thermal couples s are formed as part of the structure.

10. The apparatus of claim 1 wherein the plurality of thermal couples are in a location selected from one of on a second exterior surface of the structure and inside an interior of the structure.

11. The apparatus of claim 1 wherein the plurality of thermal couples are formed by at least one of spraying the first metal onto a second exterior surface of the structure, spraying the second metal onto the second exterior surface of the structure, chemical vapor deposition, electron beam epitaxy, molecular beam epitaxy, printing the first metal onto the second exterior surface of the structure, printing the second metal onto the second exterior surface of the structure, sintering a powdered form of the first metal onto the second exterior surface of the structure, and sintering a powdered form of the second metal onto the second exterior surface of the structure.

12. A method for manufacturing an electrical current generation system, the method comprising:
   attaching, to a tube configured to allow a flow of fluid hotter than an exterior temperature outside of the tube, a structure comprising a first portion integral with a second portion, wherein the first portion is attached to a first exterior surface of the tube and also conforms to a shape of the tube, wherein the second portion forms a bend angle relative to the first portion at an intersection of the first portion and the second portion in order that the second portion extends radially outwardly from the first exterior surface of the tube; and
   forming a thermopile attached to the structure, wherein a first part of the thermopile is formed on the first portion and a second part of the thermopile is formed on the second portion, wherein the thermopile comprises a plurality of thermal couples connected in series, wherein a first plurality of junctions of the plurality of thermal couples is on the first portion, and wherein a second plurality of junctions of the plurality of thermal couples is on the second portion.

13. The method of claim 12, wherein forming the thermopile comprises:

depositing a number of materials in a location on the structure, wherein the number of materials is deposited by at least one of spraying the number of materials, chemical vapor deposition, electron beam epitaxy, molecular beam epitaxy, and sintering a powdered form of the number of materials and wherein the location is selected from one of on a surface of the structure and in an interior of the structure.

14. A method of generating an electrical current from an energy harvesting device connected to a tube, the energy harvesting device being formed on a structure having a first portion and a second portion, wherein the energy harvesting device is configured to generate an electrical current when a difference in temperature is present between the first portion and the second portion, wherein a number of thermopiles extend on both the first portion and the second portion, wherein the first portion lies on a surface of the tube and conforms to a shape of the tube, wherein the number of thermopiles partially extend across the first portion, wherein the second portion extends outwardly from the object at a bend angle relative to the first portion, and wherein the number of thermopiles also extend from the first portion, across the bend angle, and partially across the second portion, and wherein the method comprises:

generating heat in the tube;

cooling the tube by thermally radiating the heat through the second portion, wherein a thermal gradient is established between the first portion and the second portion;

generating an electrical current from the energy harvesting device from the number of thermopiles based on the cooling;

receiving an electrical current from the energy harvesting device; and powering an electrical system using the electrical current received from the energy harvesting device.

15. The method of claim 14, wherein the object is an exhaust manifold for an engine and wherein the second portion and a section of the number of thermopiles extend into ambient air surrounding the object.

16. The method of claim 14, wherein the electrical system comprises a sensor device that operates using the electrical current received from the energy harvesting device.

17. The method of claim 14, wherein the first portion has a higher temperature than the second portion and wherein the structure is configured to transfer thermal energy from the first portion to the second portion.

* * * * *